US012742235B2

(12) United States Patent
Kwon et al.

(10) Patent No.: US 12,742,235 B2
(45) Date of Patent: Sep. 22, 2026

(54) OPTICAL INTEGRATED DEVICE AND MANUFACTURING METHOD OF THE SAME

(71) Applicant: Electronics and Telecommunications Research Institute, Daejeon (KR)

(72) Inventors: O-Kyun Kwon, Daejeon (KR); Namje Kim, Daejeon (KR); Ho Sung Kim, Daejeon (KR); Miran Park, Daejeon (KR); Seungchul Lee, Daejeon (KR); Won Seok Han, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 707 days.

(21) Appl. No.: 17/968,126

(22) Filed: Oct. 18, 2022

(65) Prior Publication Data

US 2023/0227960 A1 Jul. 20, 2023

(30) Foreign Application Priority Data

Jan. 14, 2022 (KR) ........................ 10-2022-0005716

(51) Int. Cl.

*G02B 6/132* (2006.01)
*C23C 14/04* (2006.01)
*G02B 6/12* (2006.01)

(52) U.S. Cl.

CPC ............ *C23C 14/042* (2013.01); *G02B 6/132* (2013.01); *G02B 2006/12173* (2013.01)

(58) Field of Classification Search

CPC ...................................................... G02B 6/132
USPC ............................................................ 385/14
See application file for complete search history.

(56) References Cited

U.S. PATENT DOCUMENTS

| | | | | |
|---|---|---|---|---|
| 6,243,517 B1 * | 6/2001 | Deacon | G02B 6/42 385/24 |
| 6,324,204 B1 * | 11/2001 | Deacon | H01S 5/141 372/20 |
| 6,341,189 B1 | 1/2002 | Deacon | |
| 6,393,185 B1 * | 5/2002 | Deacon | G02B 6/42 385/12 |
| 6,593,162 B1 | 7/2003 | Park et al. | |

(Continued)

FOREIGN PATENT DOCUMENTS

| | | | |
|---|---|---|---|
| JP | 2003513328 A * | 4/2003 | G02B 6/1228 |
| JP | 2003-344680 A | 12/2003 | |

(Continued)

OTHER PUBLICATIONS

Korean Office Action Issued on Apr. 10, 2025, in Counterpart Korean Patent Application No. 10-2022-0005716 (6 Pages in English, 6 Pages in Korean).

(Continued)

*Primary Examiner* — Kaveh C Kianni
(74) *Attorney, Agent, or Firm* — NSIP Law

(57) ABSTRACT

Provided is a method of manufacturing an optical integrated device. The method includes forming a lower clad layer on a substrate, forming a plurality of mask patterns arranged in one direction on the lower clad layer, forming a core layer on a portion of the lower clad layer by a selective area growth method using the mask patterns as deposition masks, and forming an upper clad layer on the core layers, wherein the mask patterns have different widths or include mask layers of different materials.

9 Claims, 11 Drawing Sheets

(56) References Cited

U.S. PATENT DOCUMENTS

| | | | | |
|---|---|---|---|---|
| 6,934,313 | B1 * | 8/2005 | Deacon | H01S 5/4062 372/39 |
| 7,437,029 | B2 | 10/2008 | Joyner et al. | |
| 9,625,648 | B2 | 4/2017 | Prosyk et al. | |
| 2005/0276557 | A1 * | 12/2005 | Bour | B82Y 20/00 385/131 |
| 2006/0104583 | A1 | 5/2006 | Kim et al. | |
| 2006/0126992 | A1 * | 6/2006 | Hashimoto | G02B 6/12009 385/14 |
| 2006/0159133 | A1 | 7/2006 | Hwang et al. | |
| 2011/0133063 | A1 | 6/2011 | Ji et al. | |
| 2014/0254998 | A1 * | 9/2014 | Furuya | G02B 6/1228 438/69 |
| 2015/0301283 | A1 | 10/2015 | Bi et al. | |

FOREIGN PATENT DOCUMENTS

| | | | | |
|---|---|---|---|---|
| JP | 2004170627 | A * | 6/2004 | |
| JP | 2010-122350 | A | 6/2010 | |
| JP | 2011-118399 | A | 6/2011 | |
| KR | 10-0651477 | B1 | 11/2006 | |
| KR | 10-2065208 | B1 | 2/2020 | |
| WO | WO-2004025342 | A1 * | 3/2004 | G02B 6/136 |

OTHER PUBLICATIONS

Tsuchiya, T., et al. "Selective-area growth of high-crystalline-quality InGaAlAs by metal-organic vapor-phase epitaxy." *Journal of crystal growth* vol. 248 (2003). pp. 384-389.

Tsuchiya, T., et al. "InGaAlAs selective-area growth on an InP substrate by metalorganic vapor-phase epitaxy." *Journal of crystal growth* vol. 276 (2005). pp. 439-445.

Décobert, J., et al. "Modeling and characterization of AlGaInAs and related materials using selective area growth by metal-organic vapor-phase epitaxy." *Journal of crystal growth* vol. 298 (2007). pp. 28-31.

F. Racedo, N. et al. "Influence of mask design on the growth of InGaAs/InAlAs quantum wells on patterned substrates." *Materials Science and Engineering*: vol. B 74 (2000). pp. 12-16.

Tsuji, Masayoshi, et al. "Large bandgap energy control of InAlAsInGaAs multiple quantum wells selectively grown by low-pressure MOVPE." *Journal of crystal growth* vol. 170. Issue 1-4 (1997). pp. 669-673.

Deng, Qiufang, et al. "AlGaInAs EML having high extinction ratios fabricated by identical epitaxial layer technique." *Optics Communications* vol. 413 (2018). pp. 54-57.

Zhang, Can, et al. "Multi-channel DFB laser arrays fabricated by SAG technology." *Optics Communications* vol. 300 (2013). pp. 230-235.

* cited by examiner

OPTICAL INTEGRATED DEVICE AND MANUFACTURING METHOD OF THE SAME

CROSS-REFERENCE TO RELATED APPLICATIONS

This U.S. non-provisional patent application claims priority under 35 U.S.C. § 119 of Korean Patent Application No. 10-2022-0005716, filed on Jan. 14, 2022, the entire contents of which are hereby incorporated by reference.

BACKGROUND

The present disclosure relates to an optical integrated device and a manufacturing method thereof, and to an optical integrated device for optical communication and a manufacturing method thereof.

A recent wired/wireless convergence service requires a large-capacity and high-efficiency communication infrastructure, and various communication networks and component technologies are being used. Among them, optical network technology based on optical technology is becoming a key element in the construction of mobile communication services and high-speed Internet networks. High-speed, high-power, and high-temperature operation characteristics are important for core optical device technology of optical networks to support such large-capacity, ultra-low latency, and ultra-connected wired and wireless services.

SUMMARY

The present disclosure provides a method of manufacturing an optical integrated device capable of increasing productivity.

An embodiment of the inventive concept provides a method of manufacturing an optical integrated device, the method including: forming a lower clad layer on a substrate; forming a plurality of mask patterns arranged in a first direction on the lower clad layer; forming a core layer on a portion of the lower clad layer by a selective area growth method using the mask patterns as deposition masks; and forming an upper clad layer on the core layers, wherein the mask patterns have different widths in a second direction intersecting the first direction or include mask layers of different materials.

In an embodiment, the mask patterns may include: first mask patterns having a first pattern width and having a central opening width partially exposing the lower clad layer; and second mask patterns having a second pattern width less than the first pattern width and having the central opening width adjacent to one side of the first mask patterns.

In an embodiment, the mask patterns may further include third mask patterns having a third pattern width less than the second pattern width and having the central opening width adjacent to the other side of the second mask patterns facing the first mask patterns.

In an embodiment, the mask patterns may further include fourth mask patterns having a fourth pattern width less than the third pattern width and having the central opening width adjacent to the other side of the second mask patterns facing the first mask patterns.

In an embodiment, the core layers may include: a first device core formed between the first mask patterns; and a second device core connected to the first device core and formed between the second mask patterns.

In an embodiment, the core layers may further include a third device core connected to one side of the second device core opposite to the first device core and formed between the third mask patterns.

In an embodiment, the core layers may further include a fourth device core connected to one side of the third device core opposite to the second device core and formed between the fourth mask patterns.

In an embodiment, the first to fourth device cores may include semiconductor cores having energy band gaps of 1249 nm, 1260 nm, 1275 nm, and 1290 nm wavelengths, respectively.

In an embodiment, the first device core may include a passive waveguide core, wherein the second device core may include an electro-optic modulator core, wherein the third device core may include a laser diode core, wherein the fourth device core may include a photodiode core.

In an embodiment, the lower clad layer below the third device core may have Bragg gratings.

In an embodiment, the substrate may have first to fourth regions.

In an embodiment, the mask patterns may include: lower mask patterns formed on the lower clad layer adjacent to the first to fourth regions; and first central mask patterns formed on the lower mask patterns adjacent to the second to fourth regions.

In an embodiment, the lower mask patterns may include aluminum oxide, wherein the first central mask patterns may include silicon oxide.

In an embodiment, the mask patterns may further include second central mask patterns formed on first central mask patterns adjacent to the third and fourth regions.

In an embodiment, the second central mask patterns may include silicon nitride.

In an embodiment, the mask patterns may further include upper mask patterns formed on second central mask patterns adjacent to the fourth region.

In an embodiment, the upper mask patterns may include hafnium oxide or zirconium oxide.

In an embodiment of the inventive concept, an optical integrated device includes: a substrate; a lower clad layer on the substrate; a core layer extending in one direction on the lower clad layer; an upper clad layer disposed on the core layer and the lower clad layer outside the core layer; and a plurality of electrodes disposed on the upper clad layer, wherein the core layer includes: a first device core; a second device core connected to the first device core and having a width equal to a width of the first device core; a third device core connected to the second device core and having the same width as widths of the first and second device cores; and a fourth device core connected to the third device core and having the same width as the widths of the first to third device cores.

In an embodiment, the first device core may include a passive waveguide core, wherein the second device core may include an electro-optic modulator core, wherein the third device core may include a laser diode core, wherein the fourth device core may include a photodiode core.

In an embodiment, the lower clad layer below the third device core may have Bragg gratings.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings:

Figure 13:
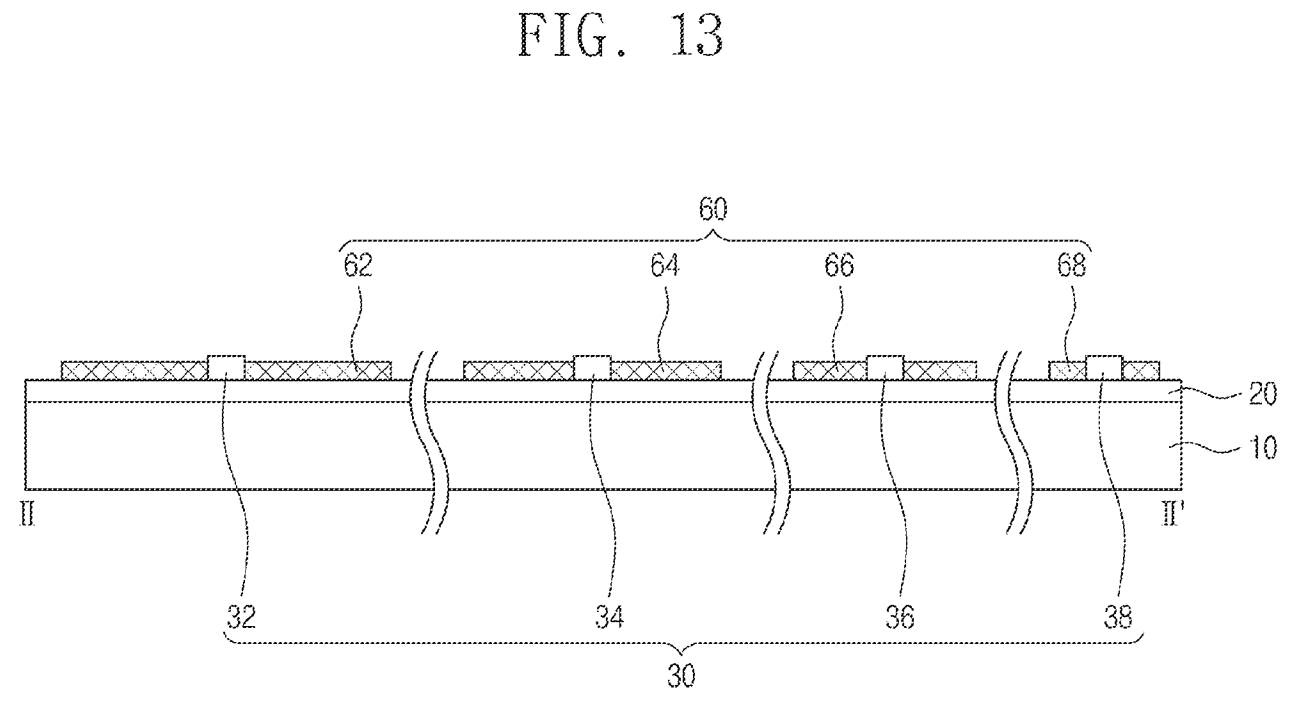

FIGS. 11 to 16 are process cross-sectional views taken along line II-II' of FIG. 6;

DETAILED DESCRIPTION

Figure 1:
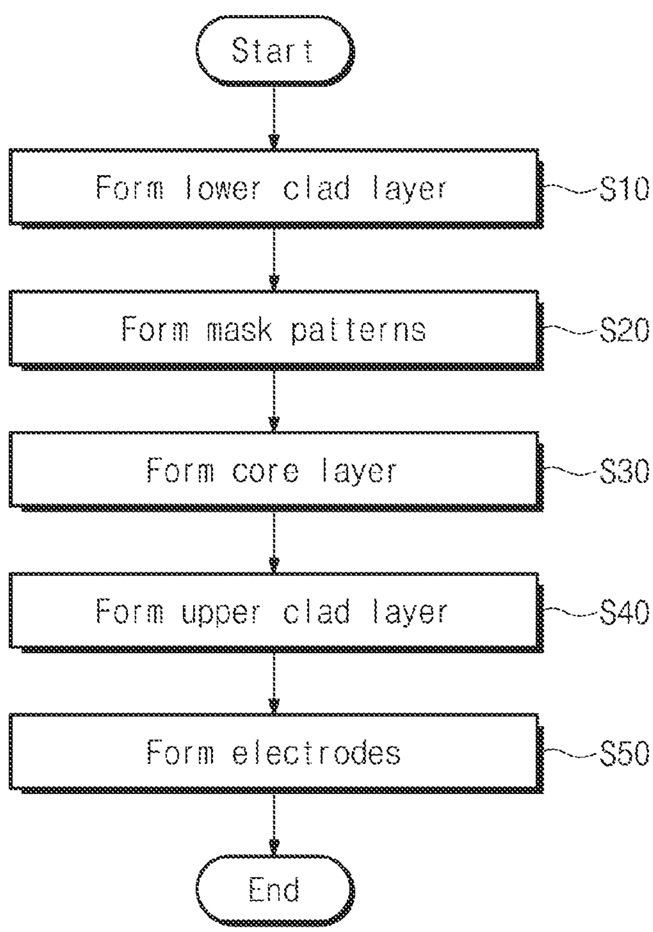
FIG. 1 shows an example of a method of manufacturing an optical integrated device according to the concept of the inventive concept.
Figure 2:
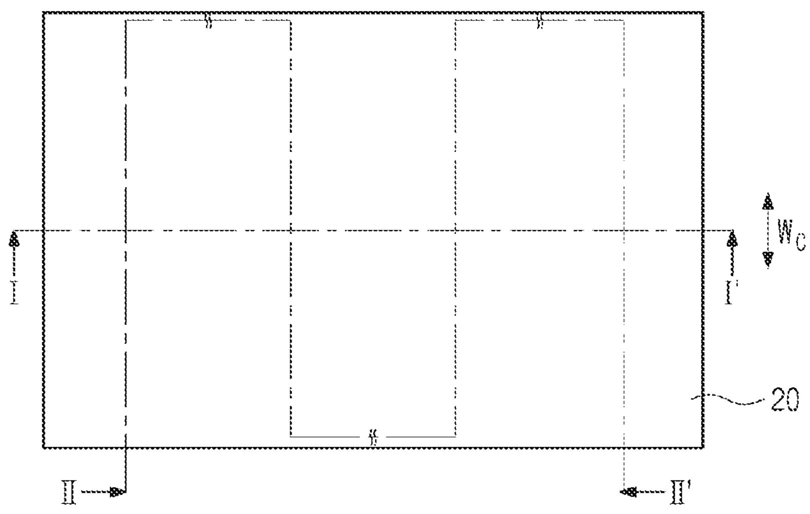
FIGS. 2 to 6 are plan views of an optical integrated device of the inventive concept.

Hereinafter, embodiments of the inventive concept will be described in detail with reference to the accompanying drawings. Advantages and features of the inventive concept, and a method of achieving them, will become apparent with reference to the embodiments described below in detail in conjunction with the accompanying drawings. However, the inventive concept is not limited to the embodiments described herein, and may be embodied in different forms. Rather, the embodiments introduced herein are provided so that this disclosure may be thorough and complete and the spirit of the inventive concept may be sufficiently conveyed to those skilled in the art, and the inventive concept is only defined by the scope of the claims. Like reference numerals refer to like elements throughout the specification.

The terms used in this specification are for describing embodiments and are not intended to limit the inventive concept. In this specification, the singular form also includes the plural form unless specifically stated in the phrase. As used in the specification, in relation to 'comprises' and/or 'comprising', the mentioned elements, steps, operations and/or elements do not exclude the presence or addition of one or more other elements, steps, operations and/or elements. Also, in the specification, the waveguide, the core, and the modulation may be understood as meanings mainly used in the field of optical communication. Since this is according to a preferred embodiment, reference signs provided in the order of description are not necessarily limited to the order.

FIG. 1 shows an example of a method of manufacturing an optical integrated device according to the concept of the inventive concept. FIGS. 2 to 6 are plan views of the optical integrated device of the inventive concept, FIGS. 7 to 10 are cross-sectional views showing the process taken along line I-I' of FIG. 6, and FIGS. 11 to 16 are process cross-sectional views taken along line II-II' of FIG. 6.

Referring to FIGS. 1, 2, 7, and 11, a lower clad layer 20 is formed on the substrate 10 (S10). The substrate 10 may include a glass or semiconductor single crystal wafer. According to an example, the substrate 10 may have a first region 12, a second region 14, a third region 16, and a fourth region 18. The first region 12, the second region 14, the third region 16, and the fourth region 18 may be arranged in one direction. The first region 12 may be provided on one side of the second region 14. The first region 12 may be a passive waveguide region. The second region 14 may be provided between the first region 12 and the third region 16. The second region 14 may be an electro-absorption conversion region. The third region 16 may be provided between the second region 14 and the fourth region 18. The third region 16 may be a laser diode region. The fourth region 18 may be a light detector region. The lower clad layer 20 may include InP doped with n-type, but the inventive concept is not limited thereto.

Figure 3:
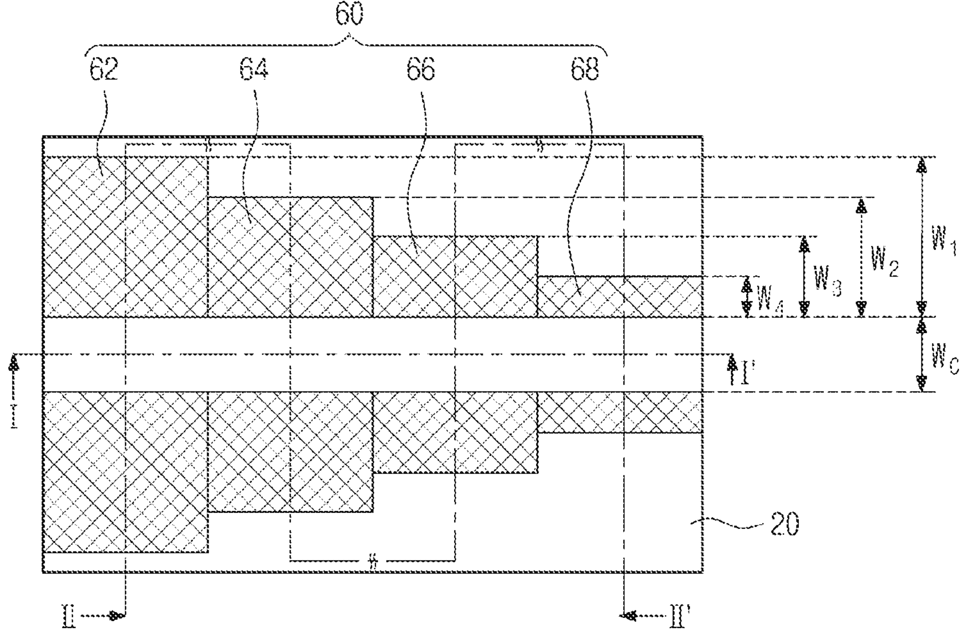
Figure 7:
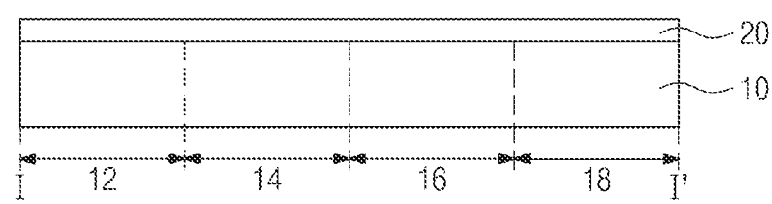
FIGS. 7 to 10 are process cross-sectional views taken along line I-I' of FIG. 6.
Figure 8:
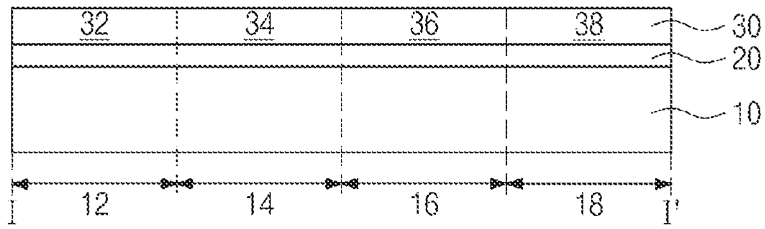
Figure 9:
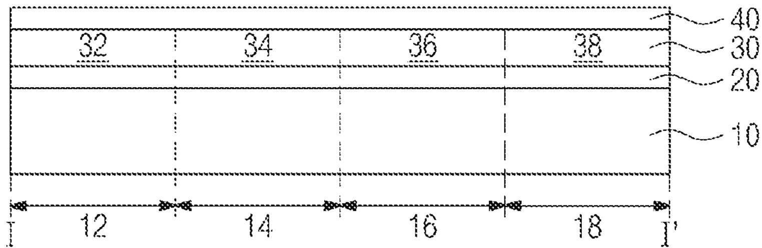
Figures 11, 12:
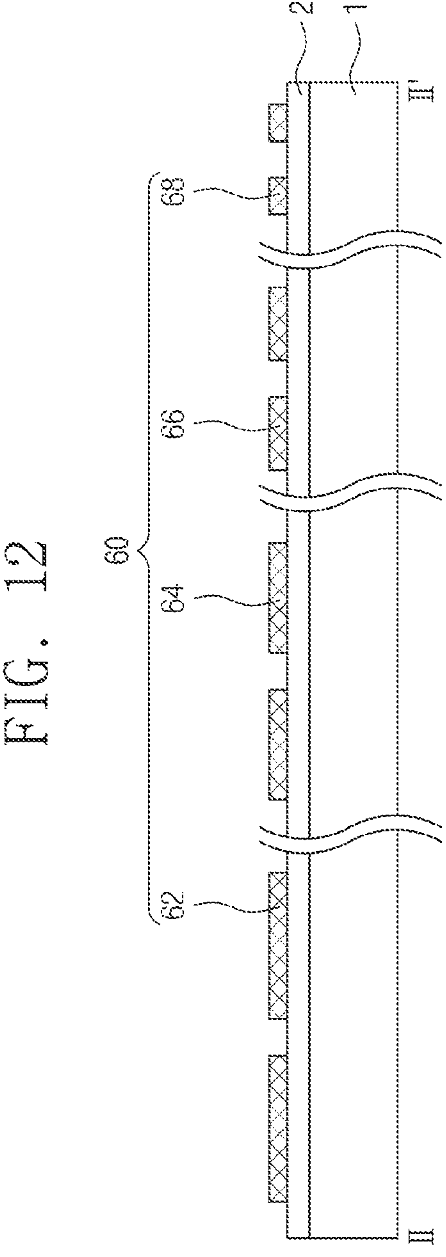

Referring to FIGS. 3, 7, and 12, mask patterns 60 are formed on the lower cladding layer 20 (S20). The mask patterns 60 may be arranged in one direction. The mask patterns 60 may be formed through a dielectric deposition process, a photolithography process, and an etching process. For example, the mask patterns 60 may include silicon oxide ($SiO_2$) or silicon nitride (SiN). According to an example, the mask patterns 60 may include first mask patterns 62, second mask patterns 64, third mask patterns 66, and a fourth mask pattern 68.

Each of the first mask patterns 62 may have a first width W1. The first mask patterns 62 may be formed to have a central opening width WC therebetween.

The second mask patterns 64 may be connected to one side of the first mask patterns 62. Each of the second mask patterns 64 may have a second width W2. The second width W2 may be less than the first width W1. The second mask patterns 64 may have the same central opening width WC as the first mask patterns 62.

The third mask patterns 66 may be connected to the other side of the second mask patterns 64 opposite to the first mask patterns 62. Each of the third mask patterns 66 may have a third width W3. The third width W3 may be less than the second width W2. The third mask patterns 66 may have the same central opening width WC as the first mask patterns 62 and the second mask patterns 64.

The fourth mask patterns 68 may be connected to the other side of the third mask patterns 66 opposite to the second mask patterns 64. Each of the fourth mask patterns 68 may have a fourth width W4. The fourth width W4 may be less than the third width W3. The fourth mask patterns 68 may have the same central opening width WC as the first mask patterns 62 and the second mask patterns 64.

Referring to FIGS. 1, 4, 8, and 13, a core layer 30 is formed on the lower clad layer 20 between the mask patterns 60 (S30).

The core layer 30 may be formed by a selective area growth method using the mask patterns 60 as deposition masks. The selective area growth method may include an MBE method or a chemical vapor deposition method. For example, the core layer 30 may include a III-V semiconductor of InAlGaAs or InGaAsP. According to an example, the core layer 30 may include a first device core 32, a second device core 34, a third device core 36, and a fourth device core 38. The first device core 32, the second device core 34, the third device core 36, and the fourth device core 38 may be simultaneously formed by a selective area growth method. The first device core 32, the second device core 34, the third device core 36, and the fourth device core 38 may be laser diode cores. The first device core 32, the second device core 34, the third device core 36, and the fourth device core 38 may have a blue transition or a red transition of a group III-V semiconductor according to changes in widths of the first mask patterns 62, the second mask patterns 64, the third mask patterns 66, and the fourth mask pattern 68 during their growth. For example, the first device core 32, the second device core 34, the third device core 36, and the fourth device core 38 may include semiconductor cores having energy bandgaps of about 1249 nm, about 1260 nm, about 1275 nm, and about 1290 nm wavelengths, respectively. In addition, the first device core 32, the second device core 34, the third device core 36, and the fourth device core 38 may include semiconductor cores having energy bandgaps of about 1290 nm, about 1275 nm, about 1260 nm, and about 1249 nm wavelengths, respectively. Alternatively, the first device core 32 may include a passive waveguide core. The second device core 34 may include an electro-absorption modulator core. The third device core 36 may include a laser diode core. The fourth device core 38 may include a light detector core.

Therefore, the method of manufacturing an optical integrated device of the inventive concept is a selective area growth method using mask patterns 60 having different widths as deposition masks so that by forming the core layer of a plurality of optical devices at once, productivity may be increased.

Figure 14:
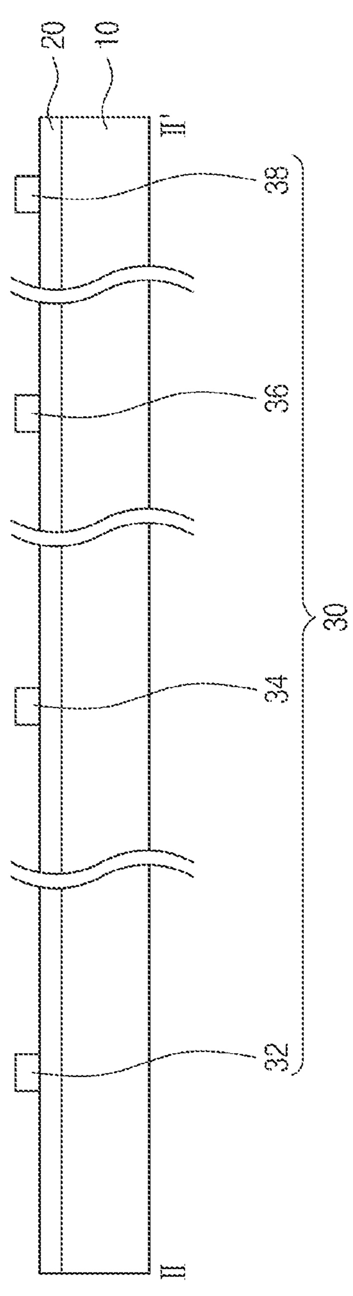
Figure 15:
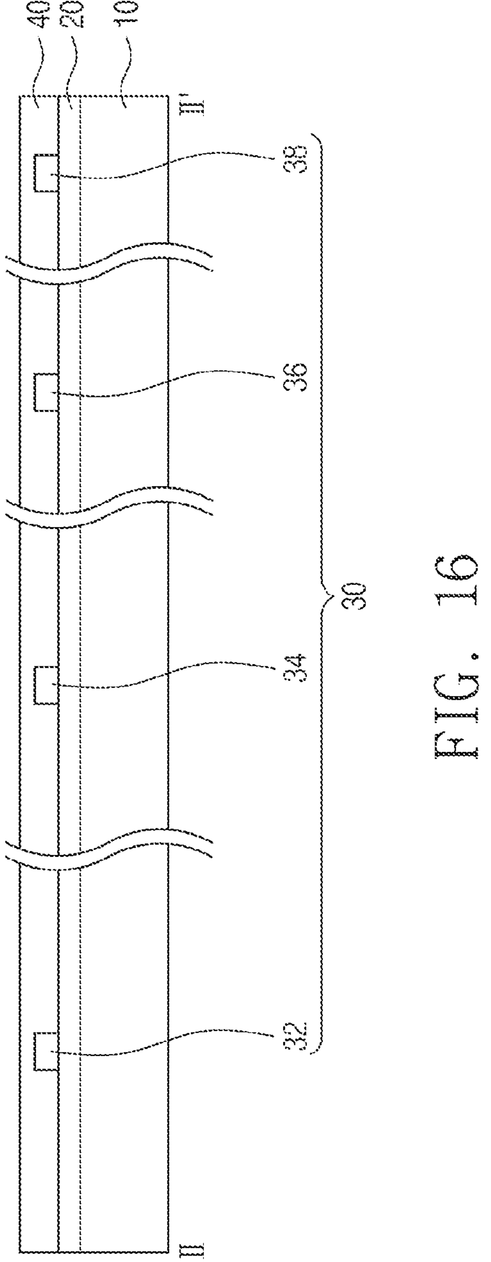
Figure 16:
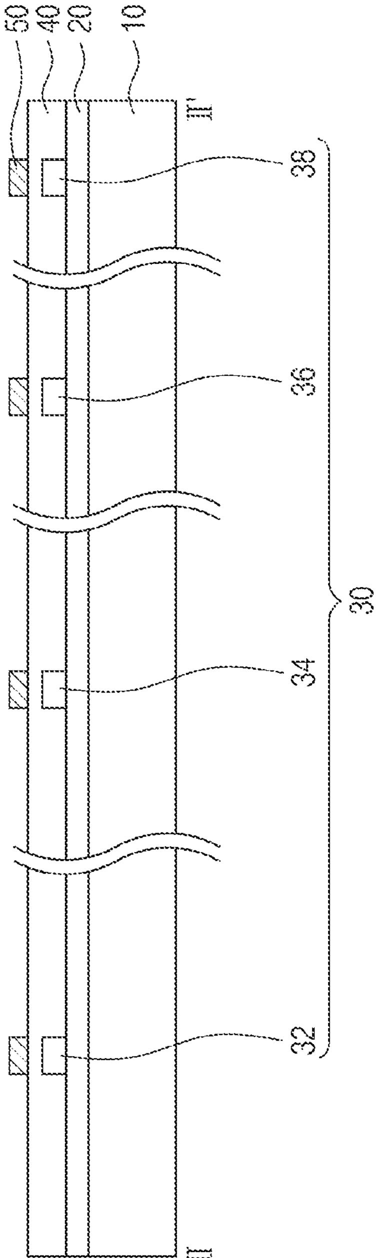

Referring to FIG. 14, the mask patterns 60 are removed. The mask patterns 60 may be removed by a wet etching process. Alternatively, the mask patterns 60 may be removed by a sacrificial layer (not shown) provided thereunder, but the inventive concept is not limited thereto.

Referring to FIGS. 1, 5, 9, and 15, the upper clad layer 40 is formed on the core layer 30 and the lower clad layer 20 (S40). The upper clad layer 40 may include p-type doped InP and p-type InGaAs electrode layers, but the inventive concept is not limited thereto.

Referring to FIGS. 1, 6, 10, and 16, electrodes 50 are formed on the upper clad layer 40 (S50). The electrodes 50 may be formed on the upper clad layer 40 of the first region 12, the second region 14, the third region 16, and the fourth region 18 through the deposition process, the photolithography process, and the etching process of the metal layer.

Figure 10:
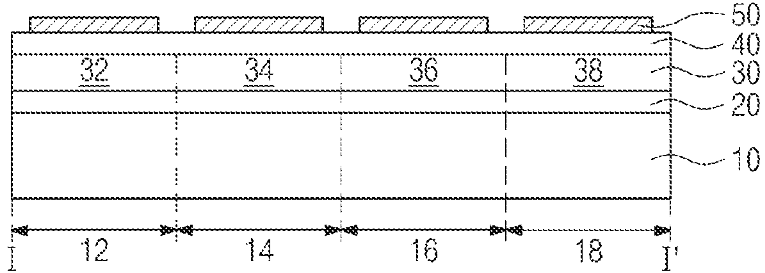
Figure 17:
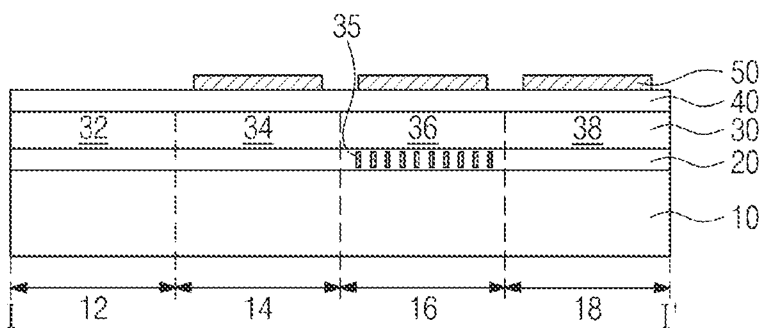
FIG. 17 is a cross-sectional view illustrating an example of a lower clad layer and a core layer of FIG. 10.

FIG. 17 shows an example of the lower clad layer 20 and the core layer 30 of FIG. 10.

Referring to FIG. 17, Bragg gratings 35 may be provided in the lower clad layer 20 of the third region 16. The Bragg gratings 35 may obtain a gain of laser light in the lower clad layer 20 and the third device core 36. The lower clad layer 20, the Bragg gratings 35, the third device core 36, and the upper clad layer 40 may function as a laser diode. Although not shown in the drawing, the Bragg gratings 35 may be provided in the upper clad layer 40 of the third region 16, but the inventive concept is not limited thereto.

The upper clad layer 40 of the first region 12 may be exposed without the electrode 50. The lower clad layer 20, the first device core 32, and the upper clad layer 40 of the first region 12 may function as a passive waveguide. That is, the first device core 32 may include a passive waveguide core, the second device core 34 may include an electro-absorption modulator core, the third device core 36 may include a laser diode core, and the fourth device core 38 may include a light detector core.

Figure 4:
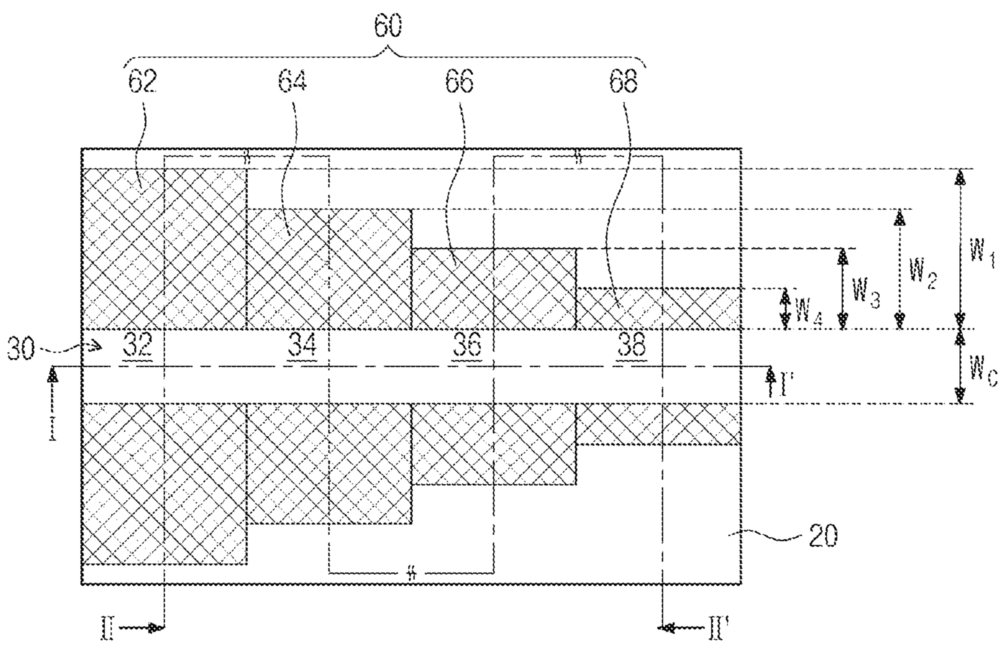
Figure 5:
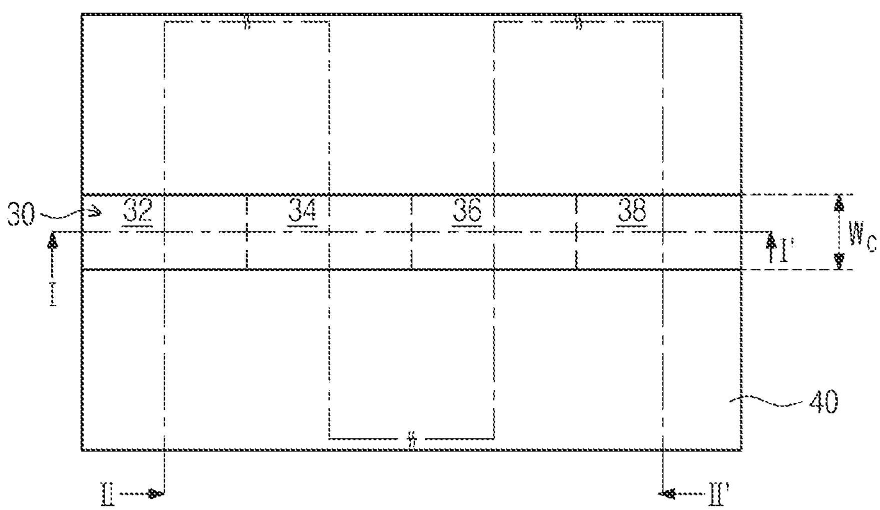
Figure 6:
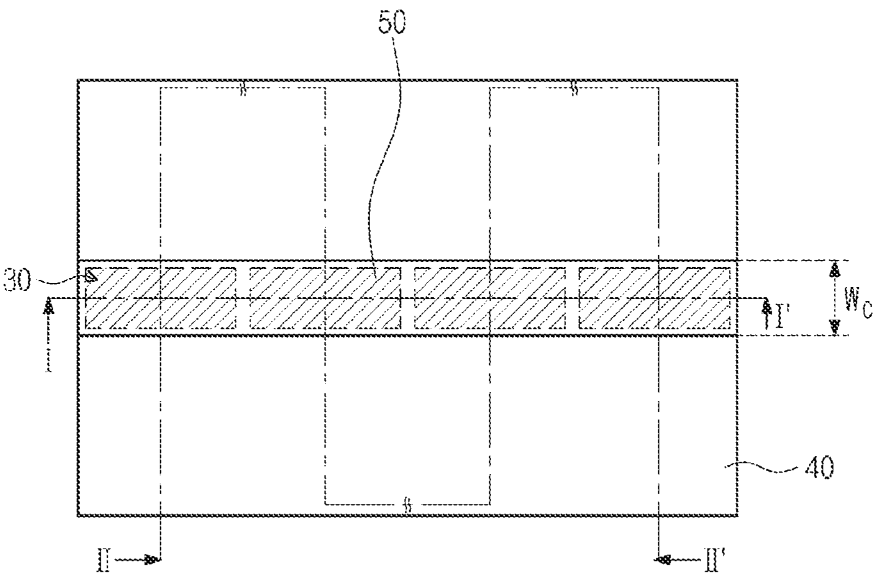
Figure 18:
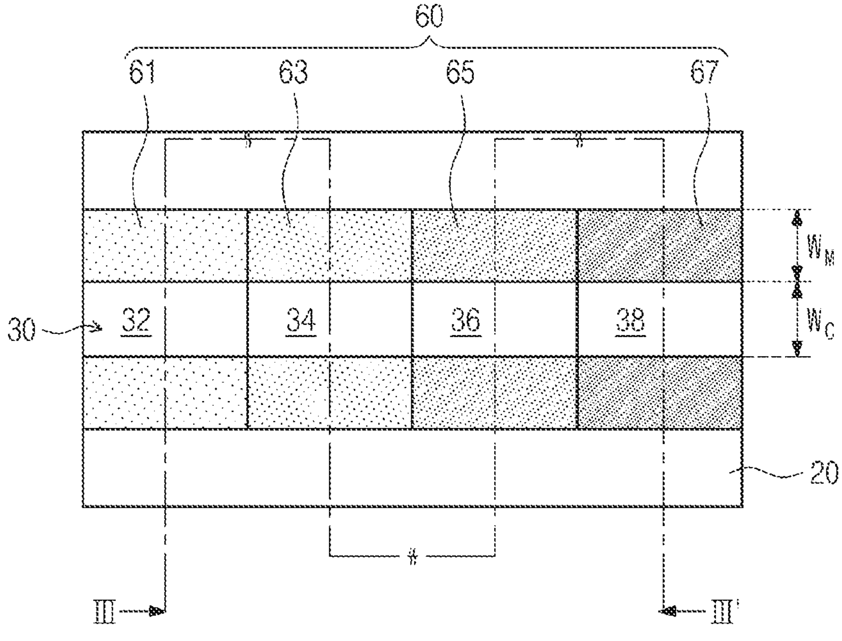
FIG. 18 is a plan view illustrating an example of the mask patterns of FIG. 4.
Figure 19:
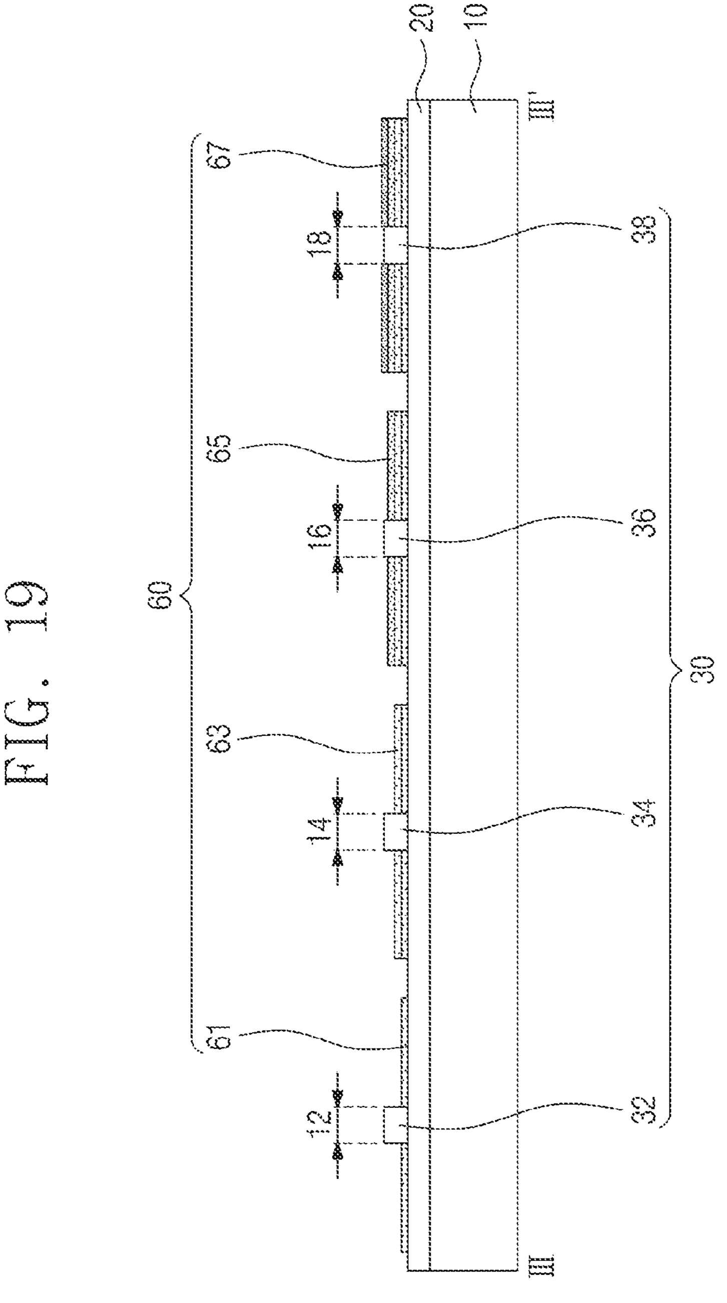
FIG. 19 is a cross-sectional view taken along line III-III' of FIG. 18.

FIG. 18 shows an example of the mask patterns 60 of FIG. 4. FIG. 19 is a view taken along line III-III' of FIG. 18.

Referring to FIGS. 18 and 19, each of the mask patterns 60 may have the same width WM. The mask patterns 60 may include lower mask patterns 61, first middle mask patterns 63, second middle mask patterns 65, and upper mask patterns 67. The lower mask patterns 61, the first middle mask patterns 63, the second middle mask patterns 65, and the upper mask patterns 67 may be individually exposed adjacent to the first region 12, the second region 14, the third region 16, and the fourth region 18, respectively.

The lower mask patterns 61, the first middle mask patterns 63, the second middle mask patterns 65, and the upper mask patterns 67 may induce a blue transition or a red transition of the energy bandgap in the first device core 32, the second device core 34, the third device core 36, and the fourth device core 38 according to their material.

The lower mask patterns 61 may be formed adjacent to the first region 12, the second region 14, the third region 16, and the fourth region 18. The lower mask patterns 61 may be formed on the lower clad layer 20 outside the first region 12, the second region 14, the third region 16, and the fourth region 18. For example, the lower mask patterns 61 may include aluminum oxide ($Al_2O_3$).

The first middle mask patterns 63 may be formed adjacent to the second region 14, the third region 16, and the fourth region 18. The first middle mask patterns 63 may be formed on the lower mask patterns 61 of the second region 14, the third region 16, and the fourth region 18. For example, the first central mask patterns 63 may include silicon oxide ($SiO_2$).

The second central mask patterns 65 may be formed adjacent to the third region 16 and the fourth region 18. The second middle mask patterns 65 may be formed on the first middle mask patterns 63 of the third region 16 and the fourth region 18. For example, the second central mask patterns 65 may include silicon nitride (SiN).

The upper mask patterns 67 may be formed adjacent to the fourth region 18. The upper mask patterns 67 may be formed on the second middle mask patterns 65 outside the fourth region 18. For example, the upper mask patterns 67 may include hafnium oxide ($HfO_2$) or zirconium oxide ($ZrO_2$).

The first device core 32, the second device core 34, the third device core 36, and the fourth device core 38 of the core layer 30 may be simultaneously formed by a selective area growth method using the mask patterns 60 as deposition masks. The first device core 32 may be formed between the lower mask patterns 61 of the first region 12. The first device core 32 may include a passive waveguide core. The second device core 34 may be formed between the first central mask patterns 63 of the second region 14. The second device core 34 may include an electro-absorption modulator core. The third device core 36 may be formed between the second central mask patterns 65 of the third region 16. The third device core 36 may include a laser diode core. The fourth device core 38 may be formed between the upper mask patterns 67 of the fourth region 18. The fourth device core 38 may include a light detector core.

Therefore, by adjusting the semiconductor energy gap to a blue or red transition in an arbitrary area, and forming a core layer of a plurality of optical devices at once through the method of manufacturing the optical integrated device of the inventive concept is a selective area growth method using mask patterns 60 of different materials as deposition masks, it is possible to increase both device performance improvement and device productivity.

As described above, the method of manufacturing an optical integrated device according to an embodiment of the inventive concept is a selective area growth method using mask patterns having different widths or different materials as deposition masks so that by forming the cores of a plurality of optical devices at once, productivity may be increased.

Although the embodiments of the inventive concept have been described, it is understood that the inventive concept should not be limited to these embodiments but various changes and modifications may be made by one ordinary skilled in the art within the spirit and scope of the inventive concept as hereinafter claimed.

What is claimed is:

1. A method of manufacturing an optical integrated device, the method comprising:

forming a lower clad layer on a substrate;

forming a plurality of mask patterns arranged in a first direction on the lower clad layer;

forming core layers on a portion of the lower clad layer by a selective area growth method using the mask patterns as deposition masks; and forming an upper clad layer on the core layers, wherein the mask patterns have different widths in a second direction intersecting the first direction or comprise mask layers of different materials, and wherein the mask patterns comprise:

first mask patterns having a first pattern width and having a central opening width partially exposing the lower clad layer; and second mask patterns having a second pattern width less than the first pattern width and having the central opening width adjacent to one side of the first mask patterns.

2. The method of claim 1, wherein the mask patterns further comprise third mask patterns having a third pattern width less than the second pattern width and having the central opening width adjacent to the other side of the second mask patterns facing the first mask patterns.

3. The method of claim 2, wherein the mask patterns further comprise fourth mask patterns having a fourth pattern width less than the third pattern width and having the central opening width adjacent to the other side of the second mask patterns facing the first mask patterns.

4. The method of claim 3, wherein the core layers comprise:

a first device core formed between the first mask patterns; and a second device core connected to the first device core and formed between the second mask patterns.

5. The method of claim 4, wherein the core layers further comprise a third device core connected to one side of the second device core opposite to the first device core and formed between the third mask patterns.

6. The method of claim 5, wherein the core layers further comprise a fourth device core connected to one side of the third device core opposite to the second device core and formed between the fourth mask patterns.

7. The method of claim 6, wherein the first to fourth device cores comprise semiconductor cores having energy band gaps of 1249 nm, 1260 nm, 1275 nm, and 1290 nm wavelengths, respectively.

8. The method of claim 6, wherein the first device core comprises a passive waveguide core, wherein the second device core comprises an electro-optic modulator core, wherein the third device core comprises a laser diode core, wherein the fourth device core comprises a photodiode core.

9. The method of claim 5, wherein the lower clad layer below the third device core has Bragg gratings.

* * * * *